United States Patent
Miura

(10) Patent No.: US 8,213,560 B2
(45) Date of Patent: Jul. 3, 2012

(54) PLL CIRCUIT

(75) Inventor: Kiyoshi Miura, Kanagawa (JP);
Michiko Miura, legal representative, Kanagawa (JP)

(73) Assignee: Sony Corporation, Tokyo (JP)

( * ) Notice: Subject to any disclaimer, the term of this patent is extended or adjusted under 35 U.S.C. 154(b) by 660 days.

(21) Appl. No.: 12/382,387

(22) Filed: Mar. 16, 2009

(65) Prior Publication Data
US 2009/0245450 A1      Oct. 1, 2009

(30) Foreign Application Priority Data

Mar. 31, 2008    (JP) ................................. 2008-089373

(51) Int. Cl.
*H03D 3/24* (2006.01)
(52) U.S. Cl. ........ 375/376; 375/215; 375/294; 375/327; 327/145; 327/156; 342/103; 455/180.3; 455/26
(58) Field of Classification Search .................. 375/376, 375/215, 294, 327; 327/145, 156; 342/103; 455/180.3, 260
See application file for complete search history.

(56) References Cited

U.S. PATENT DOCUMENTS

| | | | | |
|---|---|---|---|---|
| 6,711,229 | B1 * | 3/2004 | Harada | 375/376 |
| 2002/0021177 | A1 * | 2/2002 | Uto | 331/16 |
| 2003/0048863 | A1 * | 3/2003 | Saeki | 375/376 |

FOREIGN PATENT DOCUMENTS

| | | |
|---|---|---|
| JP | 09-093125 | 4/1997 |
| JP | 11-308101 | 11/1999 |
| JP | 2001-156629 | 6/2001 |
| JP | 2001-160752 A | 6/2001 |
| JP | 2002-033659 A | 1/2002 |
| JP | 2004-274673 A | 9/2004 |
| JP | 2006-101043 A | 4/2006 |

OTHER PUBLICATIONS

Japanese Office Action issued Apr. 27, 2010 for corresponding Japanese Application No. 2008-089373.

* cited by examiner

*Primary Examiner* — Shuwang Liu
*Assistant Examiner* — Nader Bolourchi
(74) *Attorney, Agent, or Firm* — Rader Fishman & Grauer, PLLC

(57) ABSTRACT

Disclosed herein is a phase-locked loop circuit including: a voltage controlled oscillator; a variable frequency divider circuit for frequency-dividing an oscillating signal of the voltage controlled oscillator into a 1/N (N is an integer) frequency; a phase comparator circuit for comparing phases of a frequency-divided signal and a reference signal of a reference frequency with each other; a charge pump circuit for outputting a charge pump current changed in pulse width; a loop filter for being supplied with the charge pump current and outputting a direct-current voltage changed in level; and a control circuit for calculating a value of the charge pump current as a function of the oscillating frequency of the voltage controlled oscillator and a coefficient for setting a phase locked loop band, and setting the value of the charge pump current in the charge pump circuit.

5 Claims, 6 Drawing Sheets

FIG. 2

$$fVCO = N \cdot fREF \quad \cdots (1)$$

$\begin{cases} fVCO: \text{OSCILLATING FREQUENCY OF VCO 11} \\ fREF: \text{REFERENCE FREQUENCY} \\ N: \text{FREQUENCY DIVISION RATIO OF VARIABLE FREQUENCY DIVIDER CIRCUIT 12} \end{cases}$ $$G(s) = \frac{ICP}{2\pi} \cdot \frac{ZP(s) \cdot KVCO}{sN} \quad \cdots (2)$$

$\begin{cases} ICP: \text{CHARGE PUMP CURRENT OF CHARGE PUMP CIRCUIT 14} \\ ZP(s): \text{IMPEDANCE OF LOOP FILTER 15} \\ KVCO: \text{CONTROL SENSITIVITY OF VCO 11} \\ \quad KVCO = dfVCO/dVC \\ \quad\quad dfVCO: \text{AMOUNT OF CHANGE OF OSCILLATING FREQUENCY fVCO} \\ \quad\quad dVC: \text{AMOUNT OF CHANGE OF CONTROL VOLTAGE VC} \end{cases}$ $$G = \frac{ICP}{2\pi} \cdot \frac{ZP \cdot KVCO}{N} \quad \cdots (3)$$

$$ICP = \frac{2\pi N}{ZP \cdot KVCO} G0 \quad \cdots (4)$$

$$ICP = \frac{2\pi}{ZP \cdot KVCO} \cdot \frac{fVCO}{fREF} \cdot G0 \quad \cdots (5)$$

$$\frac{fVCO}{KVCO} = A \cdot fVCO + B \quad \cdots (6)$$

$$\frac{2\pi}{ZP \cdot fREF} G0 = KBW \quad \cdots (7)$$

$$ICP = KBW(A \cdot fVCO + B) \quad \cdots (8)$$

FIG.3

$$fVCO = \frac{1}{2\pi\sqrt{LC}} \quad \cdots (11)$$

$$\begin{cases} L: \text{INDUCTANCE OF COIL FOR RESONANCE} \\ C: \text{CAPACITANCE OF CAPACITOR FOR RESONANCE} \end{cases}$$

$$KVCO = \frac{dfVCO}{dVC}$$

$$= \frac{dfVCO}{dC} \cdot \frac{dC}{dVC}$$

$$= -\frac{1}{4\pi} \frac{L}{(LC)^{3/2}} \frac{dC}{dVC}$$

$$= -\frac{1}{2} fVCO \frac{1}{C} \frac{dC}{dVC} \quad \cdots (12)$$

$$\frac{fVCO}{KVCO} = -2 \frac{C}{\frac{dC}{dVC}} \quad \cdots (13)$$

PLL CIRCUIT

BACKGROUND OF THE INVENTION

1. Field of the Invention

The present invention relates to a PLL (phase-locked loop) circuit.

2. Description of the Related Art

When a superheterodyne receiver is configured into a synthesizer system, the local oscillating signal of the receiver is formed by a PLL circuit. The PLL circuit is generally formed as indicated by reference numeral 10 in FIG. 6. Specifically, in the PLL circuit 10, an oscillating signal SVCO of a VCO (voltage controlled oscillator) 11 is supplied to a variable frequency divider circuit 12 to be frequency-divided into a frequency-divided signal SDIV of a 1/N (N is a positive integer) frequency. The frequency-divided signal SDIV is supplied to a phase comparator circuit 13. In addition, a reference signal SREF of a frequency fREF serving as a reference is supplied to the phase comparator circuit 13.

The phase comparator circuit 13 compares the phases of the frequency-divided signal SDIV and the reference signal SREF with each other. The comparison output of the phase comparator circuit 13 is supplied to a charge pump circuit 14, from which a phase comparison output whose pulse width changes in such a manner as to correspond to a phase difference between the frequency-divided signal SDIV and the reference signal SREF is extracted. Then, the comparison output is supplied to a loop filter 15, from which a direct-current voltage VC whose level changes in such a manner as to correspond to the phase difference between the frequency-divided signal SDIV and the reference signal SREF is extracted. The direct-current voltage VC is supplied as a control voltage for controlling an oscillating frequency fVCO to the VCO 11.

As a result, in a steady state, the oscillating frequency fVCO of the VCO 11 is $$fVCO = N \cdot fREF$$

Thus, the oscillating frequency fVCO of the VCO 11 can be varied by changing a frequency division ratio N.

Thus, conversion of frequency of a received signal can be performed using the oscillating signal SVCO (or a frequency-divided signal of the oscillating signal SVCO) of the VCO 11 as a local oscillating signal, and reception frequency can be varied by changing the frequency division ratio N or the reference frequency fREF. That is, reception of a synthesizer system can be performed.

The following, for example, are related art documents.

For the related art regarding the present information, reference should be made to Japanese Patent Laid-Open No. 2001-156629, Japanese Patent Laid-Open No. Hei 9-93125 and Japanese Patent Laid-Open No. Hei 11-308101.

SUMMARY OF THE INVENTION

However, when the characteristic of the PLL circuit 10 in the past is held constant, a charge pump current in the charge pump circuit 14 is controlled as a predetermined function of the oscillating frequency fVCO. Therefore, no provision can be made for a case where control sensitivity of the VCO 11 is changed according to the oscillating frequency fVCO, a case where the reference frequency fREF is changed, or a case where the band WC of the PLL circuit 10 is changed, for example.

Further, it is desirable to change the band WC in an IC (integrated circuit) for a front end ready for analog television broadcasting and digital television broadcasting. That is, whereas the band WC needs to be narrowed to improve a phase noise characteristic outside the band at a time of receiving analog television broadcasting, the band WC conversely needs to be widened to improve a phase noise characteristic within the band at a time of receiving digital television broadcasting. It is therefore desirable to change the band WC according to a system of broadcasting to be received. However, technology in the past cannot deal with such changes in the band WC.

In addition, in an IC for a recent front end, a variable-capacitance diode forming the resonant circuit of the VCO 11 is often incorporated into the IC (onto a chip). Therefore, a variation range of capacitance of the variable-capacitance diode is narrowed.

Consequently, when the variable-capacitance diode is incorporated into an IC, the variation range (sub-band) of the oscillating frequency fVCO is changed by selectively connecting a plurality of fixed capacitors to the resonant circuit of the VCO 11, and the oscillating frequency fVCO is changed by the variable-capacitance diode in each frequency variation range. Then, in this case, the oscillating frequency fVCO is not determined by control voltage VC alone, and therefore the characteristic of the PLL circuit 10 cannot be held constant by the control voltage VC alone.

In view of the above, the present invention is to improve the characteristic of the PLL circuit and simplify configuration therefor.

According to an embodiment of the present invention, there is provided a PLL circuit including: a VCO; a variable frequency divider circuit for frequency-dividing an oscillating signal of the VCO into a 1/N (N is an integer) frequency; a phase comparator circuit for comparing phases of a frequency-divided signal output from the variable frequency divider circuit and a reference signal of a reference frequency with each other; a charge pump circuit for outputting a charge pump current changed in pulse width so as to correspond to a phase difference between the frequency-divided signal and the reference signal from a comparison output of the phase comparator circuit; a loop filter for being supplied with the charge pump current and outputting a direct-current voltage changed in level so as to correspond to the phase difference between the frequency-divided signal and the reference signal, and supplying the direct-current voltage to the VCO as control voltage for controlling oscillating frequency of the VCO; and a control circuit for calculating a value of the charge pump current as a function of the oscillating frequency of the VCO and a coefficient for setting a PLL band, and setting the value of the charge pump current in the charge pump circuit.

According to the present invention, the PLL characteristic of a PLL circuit that needs to have a wide frequency range can be held constant, and a configuration therefor is simple.

BRIEF DESCRIPTION OF THE DRAWINGS

FIG. 2 is a diagram showing equations of assistance in explaining one form of the present invention;

FIG. 3 is a diagram showing equations of assistance in explaining one form of the present invention;

DETAILED DESCRIPTION OF PREFERRED EMBODIMENTS

[1] Outline of the Invention

[1-1] Example of Basic PLL Circuit

Figure 1:
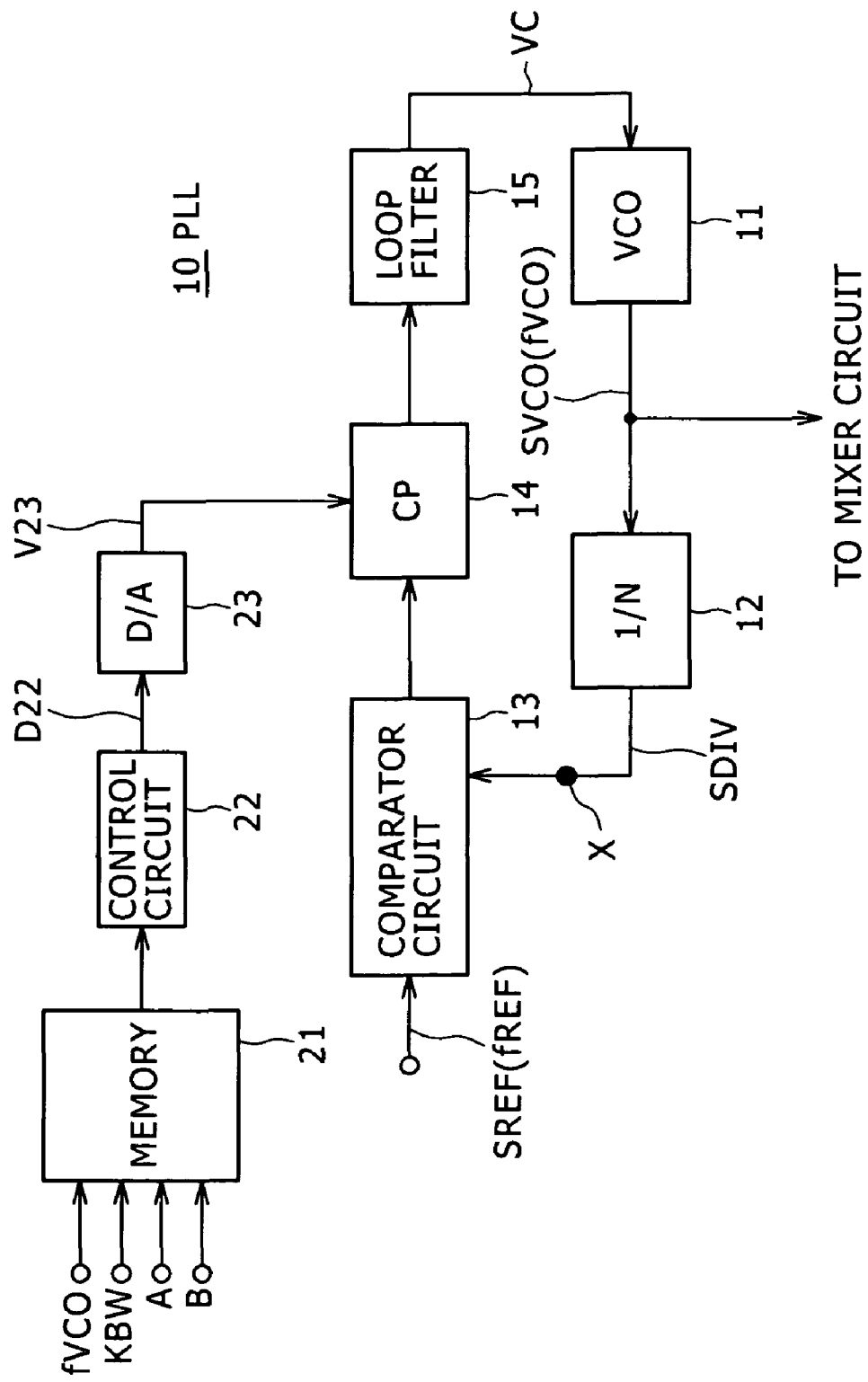
FIG. 1 is a system diagram showing one form of the present invention.

Reference numeral 10 in FIG. 1 denotes an example of a basic PLL circuit. In the PLL circuit 10, an oscillating signal SVCO of a VCO 11 is supplied to a variable frequency divider circuit 12 to be frequency-divided into a frequency-divided signal SDIV of a 1/N (N is a positive integer) frequency. The frequency-divided signal SDIV is supplied to a phase comparator circuit 13. In addition, a reference signal SREF of a frequency fREF serving as a reference is supplied to the phase comparator circuit 13.

The phase comparator circuit 13 compares the phases of the frequency-divided signal SDIV and the reference signal SREF with each other. The comparison output of the phase comparator circuit 13 is supplied to a charge pump circuit 14, from which a phase comparison output whose pulse width changes in such a manner as to correspond to a phase difference between the frequency-divided signal SDIV and the reference signal SREF is extracted. Then, the comparison output is supplied to a loop filter 15, from which a direct-current voltage VC whose level changes in such a manner as to correspond to the phase difference between the frequency-divided signal SDIV and the reference signal SREF is extracted. The direct-current voltage VC is supplied as a control voltage for controlling an oscillating frequency fVCO to the VCO 11.

As a result, in a steady state, the oscillating frequency fVCO of the VCO 11 is expressed by Equation (1) in FIG. 2. Thus, the oscillating frequency fVCO of the VCO 11 can be varied by changing a frequency division ratio N.

Thus, conversion of frequency of a received signal can be performed using the oscillating signal SVCO (or a frequency-divided signal of the oscillating signal SVCO) of the VCO 11 as a local oscillating signal, and reception frequency can be varied by changing the frequency division ratio N or the reference frequency fREF. That is, reception of a synthesizer system can be performed. Incidentally, circuits 21 to 23 will be described later.

[1-2] Characteristic of PLL Circuit

A loop characteristic of the PLL circuit 10 of a charge pump type as shown in [1-1] is determined by a transfer function G(s) at a time of an open loop of the PLL circuit 10. Specifically, when a signal line from the variable frequency divider circuit 12 to the phase comparator circuit 13 in FIG. 1 is cut at point X to make the PLL circuit 10 an open loop, a transfer function from an input terminal of the reference signal SREF of the phase comparator circuit 13 to an output terminal of the variable frequency divider circuit 12 (output terminal of the frequency-divided signal SDIV) is the transfer function G(s) expressed by Equation (2) in FIG. 2. Thus, when the frequency division ratio N is changed to vary the oscillating frequency fVCO, the transfer function G(s) is changed, and consequently the stability of the PLL circuit 10 is changed.

Therefore the transfer function G(s) needs to be prevented from being changed even when the frequency division ratio N is changed. For this, when the frequency division ratio N in Equation (2) is doubled, for example, it suffices to double a charge pump current ICP too. That is, when the magnitude of the charge pump current ICP is changed in such a manner as to correspond to the frequency division ratio N, the loop characteristic of the PLL circuit 10 can be held constant even when the frequency division ratio N is changed.

In addition, while control sensitivity KVCO of the VCO 11 is changed by the oscillating frequency fVCO of the VCO 11, this control sensitivity KVCO can also be corrected to a fixed sensitivity by changing the magnitude of the charge pump current ICP.

Further, a band WC of the PLL circuit 10 is expressed by frequency (s=2nf) where the transfer function G(s) is |G(s)|=1 [times]. Because the transfer function G(s) can be changed by the charge pump current ICP, the band WC can also be changed by the charge pump current ICP. Therefore the band WC can be held constant when the value of the charge pump current ICP is controlled so as to hold the transfer function G(s) constant.

Of course, in this case, securing a phase margin is a precondition, but is possible when a zero point is set lower than a variable range of the band WC and an extreme point is set higher than the variable range of the band WC in a second-order loop filter, for example.

Accordingly, in the present invention, each characteristic is held constant by controlling the charge pump current ICP, and particularly a configuration therefor is simplified.

Incidentally, the absolute value |G(s)| of the transfer function G(s) is also the gain of the open loop changed by frequency, and will hereinafter be described as a "gain G" for simplicity.

[1-3] Example of Control Method

When Equation (2) is expressed ignoring frequency (s=2nf) for simplicity, Equation (3) in FIG. 2 is obtained. Because the gain G is held constant, when the constant value is set as a value G0, and Equation (3) is solved for the charge pump current ICP, Equation (4) in FIG. 2 is obtained. When Equation (1) is substituted into Equation (4), Equation (4) becomes Equation (5) in FIG. 2.

However, because Equation (5) requires division, whether Equation (5) is executed by software or executed by hardware, the configuration of the software or the hardware becomes complex.

Accordingly, the present invention approximates Equation (5) by a linear equation, and obviates a need for the division. Specifically, when Equation (6) and Equation (7) in FIG. 2 are defined, and Equation (6) and Equation (7) are substituted into Equation (5), Equation (5) becomes Equation (8) in FIG. 2.

Thus, according to Equation (8), when the oscillating frequency fVCO of the VCO 11 is changed, it suffices to control the charge pump current ICP (by a linear equation) in proportion to the oscillating frequency fVCO.

On the other hand, in a front end or the like receiving television broadcasting, the resonant circuit of the VCO 11 is generally formed by a coil and a capacitor (including a variable-capacitance diode) from a viewpoint of phase noise. Thus, the oscillating frequency fVCO of the VCO 11 is expressed by Equation (11) in FIG. 3.

At this time, a variable-capacitance element, for example a variable-capacitance diode is used as a part of the capacitor so as to be able to change the oscillating frequency fVCO. Hence, when control sensitivity KVCO of the VCO 11 at this time is sought, Equation (12) in FIG. 3 is obtained. When Equation (12) is further approximated for the vicinity of a central value of control voltage VC, Equation (13) in FIG. 3 is obtained.

Equation (13) shows that when a rate of change dC/dVC is set in proportion to capacitance C, the value fVCO/KVCO on the left side is substantially constant, or can be represented by a linear equation of the oscillating frequency fVCO.

Further, as described above, when the variable-capacitance diode forming the resonant circuit of the VCO 11 is incorporated into an IC, because of a narrow variation range of capacitance of the variable-capacitance diode, the variation range (sub-band) of the oscillating frequency fVCO is changed by selectively connecting a plurality of fixed capacitors to the resonant circuit of the VCO 11, and the oscillating frequency fVCO is changed by the variable-capacitance diode in each frequency variation range.

In this case, for the rate of change dC/dVC to be set in proportion to the capacitance C, it suffices to set a ratio between the capacitance of the variable-capacitance diode and the capacitance of a fixed capacitor constant in each sub-band. This can be readily achieved by a method of changing the variable-capacitance diode by a switch, for example. Then the value fVCO/KVCO can be controlled to be substantially constant. It can therefore be said to be appropriate to make the value fVCO/KVCO a constant value, and more generally represent the value fVCO/KVCO by a linear equation of the oscillating frequency fVCO.

It is shown from the above that considering the dependence of the control sensitivity KVCO on the oscillating frequency fVCO, the band WC determined by a value KBW (Equation (7)) can be guaranteed to be constant by the charge pump current ICP shown in Equation (8).

Equation (8) has an advantage in that the band WC is determined by only one parameter, that is, the constant KBW with any oscillating frequency fVCO. It is also shown from Equation (2) that considering a variable KVCO/N to be a practical control sensitivity KVCO, it suffices simply to change the constant KBW even when the frequency division ratio N is changed.

Further, when VCO characteristics are measured in advance, and values A and B are set as a constant, the band WC can be held constant at any oscillating frequency fVCO by merely changing the constant KBW, and a need for a user to take the trouble of changing the magnitude of the charge pump current ICP according to the oscillating frequency as in the existing case is eliminated. In addition, even when the reference frequency fREF is changed, it suffices merely to change the constant KBW in proportion to the frequency division ratio N.

[2] Embodiment

As described in [1-1], the basic PLL circuit is formed as indicated by reference numeral 10 in FIG. 1, for example, and is integrated into one IC on a chip together with the circuits 21 to 23.

Further, in FIG. 1, data indicating the oscillating frequency fVCO of the VCO 11, data on the constant KBW determining the band WC, and data on the constants A and B determining the control sensitivity KVCO of the VCO 11 are prepared. These pieces of data are stored in the memory (register) 21, and supplied to the control circuit 22 to be converted into data D22 corresponding to the data described in [1-3].

The data D22 is supplied to the D/A converter circuit 23 to be converted into an analog voltage V23 by D/A conversion, the voltage V23 is supplied to constant-current sources Q1 and Q2 as a control voltage for controlling the charge pump current ICP (output current), and the magnitude of the charge pump current ICP is controlled as described in [1-3].

Incidentally, instead of writing the data indicating the oscillating frequency fVCO, it is possible to write data indicating the frequency division ratio N to the memory 21, and obtain the data corresponding to the oscillating frequency fVCO by converting the data indicating the frequency division ratio N into the oscillating frequency fVCO from Equation (1) in the control circuit 22.

[3] Example of Configuration of Charge Pump Circuit

[3-1] First Example of Configuration

Figure 4:
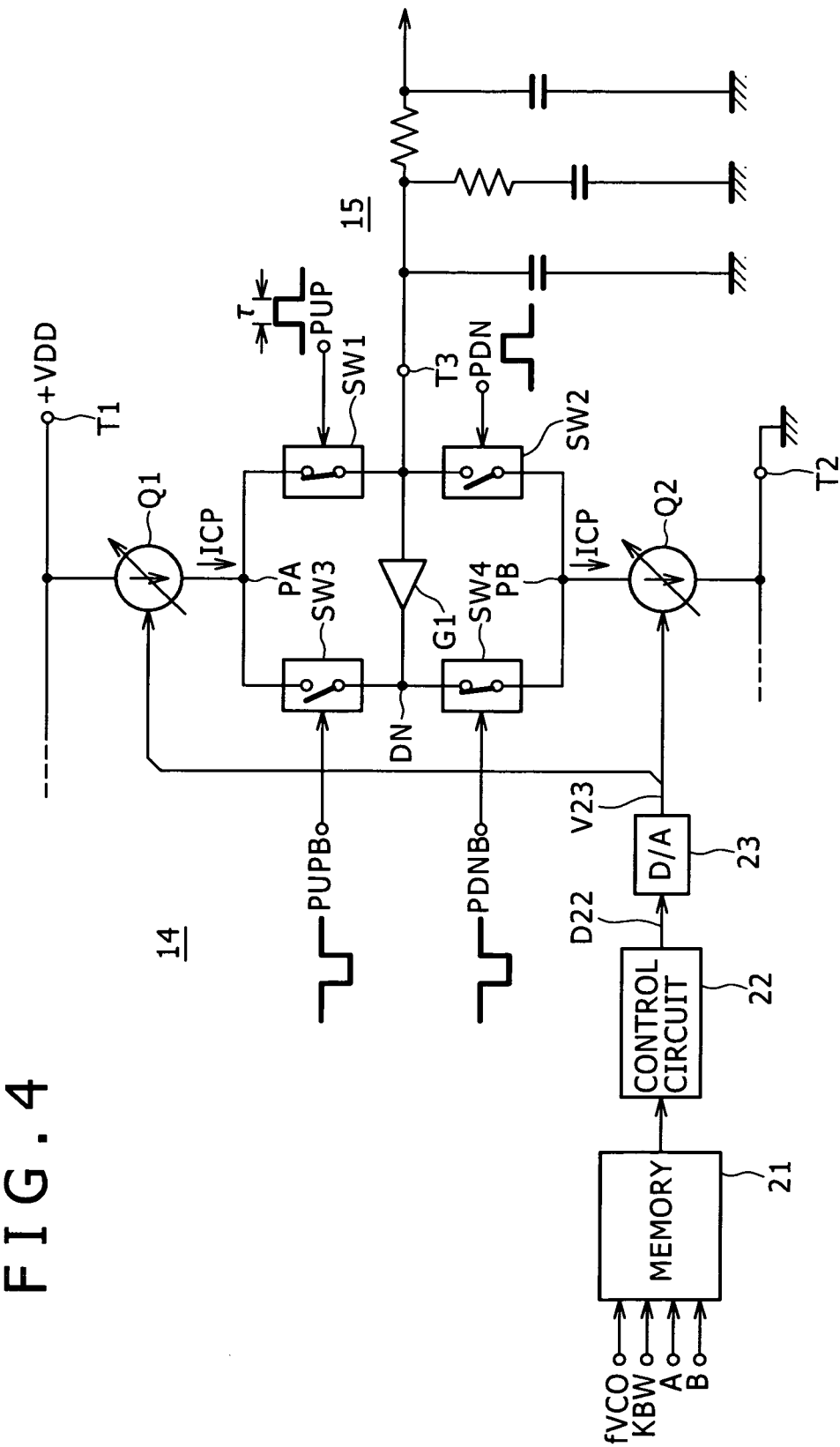
FIG. 4 is a system diagram showing one form of a part of the present invention.

FIG. 4 shows an example of the charge pump circuit 14 of a configuration referred to as a current steering type.

Specifically, four switch circuits SW1 to SW4 are connected to each other by bridge connection. A constant-current source Q1 of a discharge type is connected between a power supply terminal T1 as one potential point and a point PA of connection between the switch circuits SW1 and SW3. A constant-current source Q2 of a suction type is connected between a point PB of connection between the switch circuits SW2 and SW4 and a grounding terminal T2 as another potential point.

A point of connection between the switch circuits SW1 and SW2 is connected to an output terminal T3, and is connected to a point DN of connection between the switch circuits SW3 and SW4 via a voltage follower, that is, an amplifier G1 having a gain of one. Incidentally, the output terminal T3 is connected with the loop filter 15 in the next stage.

Further, a pulse PUP is extracted from the phase comparator circuit 13, and supplied to the switch circuit SW1. In this case, the pulse PUP has an "H" level when the frequency-divided signal SDIV is advanced in phase with respect to the reference signal SREF, and has an "L" level when the frequency-divided signal SDIV is delayed in phase with respect to the reference signal SREF. The pulse width τ of the pulse PUP corresponds to a phase difference between the signal SDIV and the signal SREF. The pulse PUP is supplied to the switch circuit SW1 as a control signal for controlling the switch circuit SW1. The switch circuit SW1 is on when PUP="H."

Similarly, a pulse PDN is extracted from the phase comparator circuit 13, and supplied to the switch circuit SW2. In this case, the pulse PDN has an "H" level when the frequency-divided signal SDIV is delayed in phase with respect to the reference signal SREF, and has an "L" level when the frequency-divided signal SDIV is advanced in phase with respect to the reference signal SREF. The pulse width of the pulse PDN corresponds to a phase difference between the signal SDIV and the signal SREF. The pulse PDN is supplied to the switch circuit SW2 as a control signal for controlling the switch circuit SW2. The switch circuit SW2 is on when PDN="H."

Further, pulses PUPB and PDNB having inverted levels of the pulses PUP and PDN are extracted from the phase comparator circuit 13. The pulses PUPB and PDNB are supplied to the switch circuits SW3 and SW4 as control signals for controlling the switch circuits SW3 and SW4. The switch circuits SW3 and SW4 are similarly subjected to on-off control by the pulses PUPB and PDNB.

The constant-current sources Q1 and Q2 are a source of supply of the charge pump current ICP. The magnitudes of output currents (charge pump current ICP) of the constant-current sources Q1 and Q2 are controlled so as to be interlocked by the circuits 21 to 23 as described in [1-3].

In such a configuration, when PUP="H" and PDN="L," the switch circuit SW1 is on and the switch circuit SW2 is off, and therefore the charge pump current ICP flows out from the constant-current source Q1 through the switch circuit SW1 to the terminal T3. Conversely, when PUP="L" and PDN="H," the switch circuit SW1 is off and the switch circuit SW2 is on, and therefore the charge pump current ICP flows out from the terminal T3 through the switch circuit SW2 to the constant-current source Q2.

Incidentally, at this time, when the pulse heights of the pulses PUP and PDN are fixed, the magnitude of the charge pump current ICP flowing through the terminal T3 is determined by the magnitudes of the output currents (charge pump current ICP) of the constant-current sources Q1 and Q2.

In addition, when the switch circuit SW1 is turned off by the pulse PUP, the switch circuit SW3 is turned on by the pulse PUPB, and therefore the potential PA of a point of connection between the constant-current source Q1 and the switch circuit SW1 is held equal to the potential of the terminal T3 by the amplifier G1. That is, both terminals of the switch circuit SW1 are at the same potential, and no leakage current flows through the switch circuit SW1.

In addition, when the switch circuit SW2 is turned off by the pulse PDN, the potential of a point PB of connection between the switch circuit SW2 and the constant-current source Q2 is held equal to the potential of the terminal T3 for a similar reason, and no leakage current flows through the switch circuit SW2.

Thus, the charge pump circuit 14 can provide a stable charge pump current ICP, and change the magnitude of the charge pump current ICP according to [1-3].

As a result, as in a front end for receiving television broadcasting, the PLL circuit 10 in which the oscillating frequency fVCO is desired to have a wide frequency range can hold the band WC constant. In addition, even when the band WC is to be changed, it suffices only to change one parameter, that is, the constant KBW. Further, when the frequency division ratio N is changed, it suffices to change the charge pump current ICP in proportion to the frequency division ratio N according to Equation (1) and Equation (8), so that control or processing is simple.

In addition, because the output terminal T3 and the connection point DN are held at the same potential by the amplifier G1, the potential of the terminal T3 and the connection point DN is not changed even when the switch circuits SW1 to SW4 are switched. Thus, there is no so-called charge sharing effect, and a matching characteristic between the constant current of the constant-current source Q1 and the constant current of the constant-current source Q2 is improved. Further, because the constant-current sources Q1 and Q2 themselves do not perform on-off operation, the charge pump circuit can be operated at high speed.

[3-2] Second Example of Configuration

Figure 5:
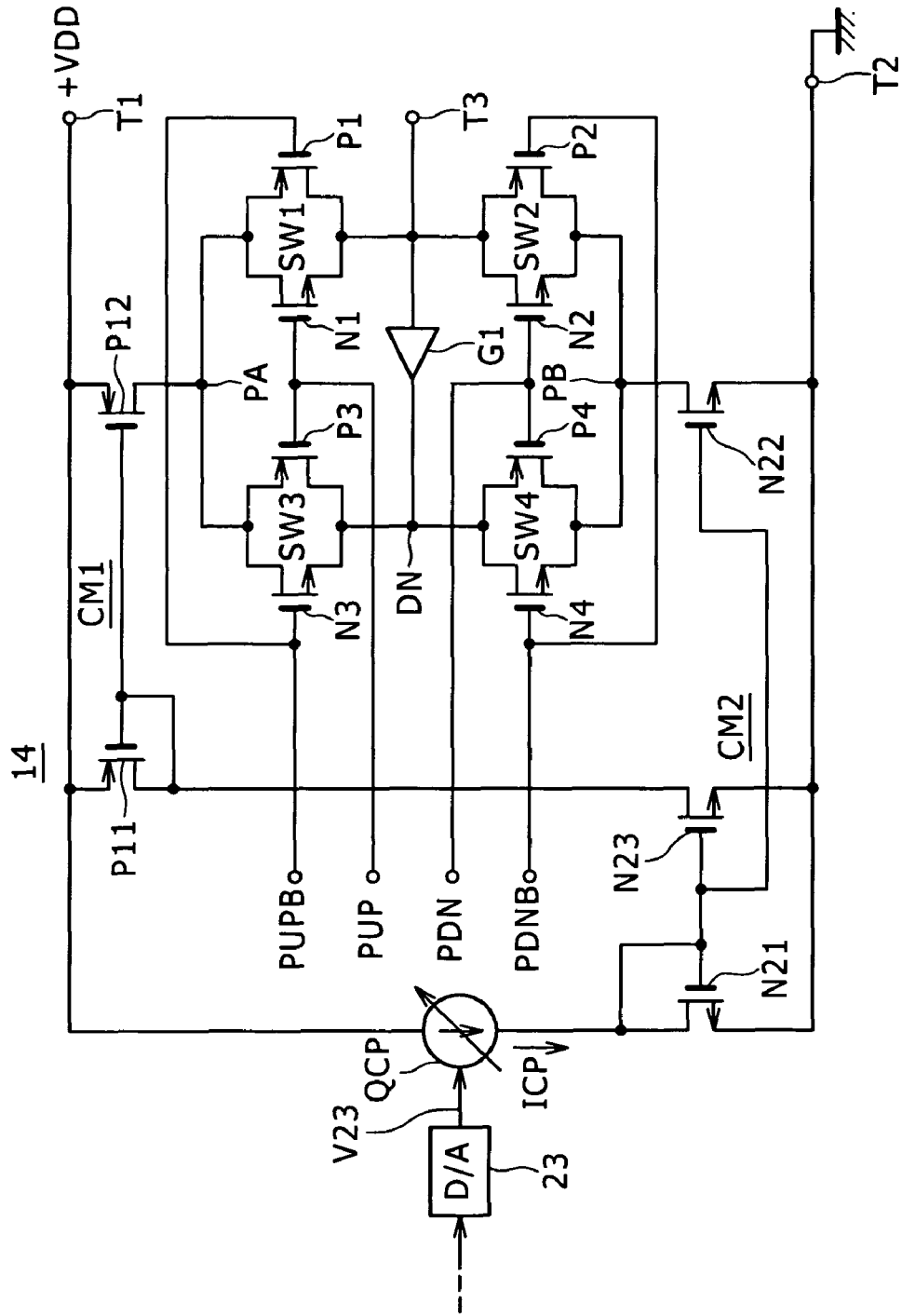
FIG. 5 is a connection diagram showing one form of a part of the present invention.
Figure 6:
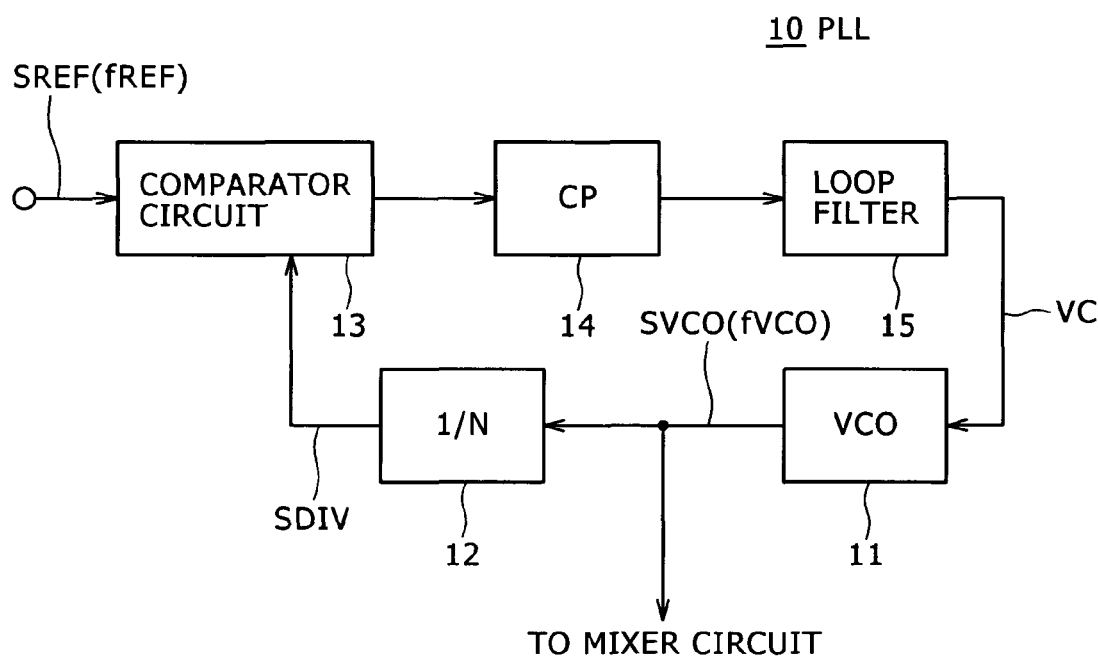
FIG. 6 is a system diagram of assistance in explaining one form of the present invention.

FIG. 5 shows an example in which the charge pump circuit 14 shown in FIG. 4 is realized by MOS-FETs (metal-oxide-semiconductor field effect transistors). Incidentally, "MOS-FETs" will hereinafter be described as "FETs" for simplicity.

Specifically, parallel circuits of drains and sources of N-channel FETs (N1 to N4) and drains and sources of P-channel FETs (P1 to P4) form switch circuits SW1 to SW4, respectively.

A source and a drain of a P-channel FET (P12) are connected between a power supply terminal T1 and a point PA of connection between the switch circuits SW1 and SW3. A source and a drain of an N-channel FET (N22) are connected between a point PB of connection between the switch circuits SW2 and SW4 and a grounding terminal T2.

In this case, the FETs (P12 and N22) operate as constant-current sources Q1 and Q2. Thus, FETs (P11 and P12) form a current mirror circuit CM1 with the power supply terminal T1 as a reference potential point and with the FET (P11) on an input side. In addition, FETs (N21 to N23) form a current mirror circuit CM2 with the grounding terminal T2 as a reference potential point and with the FET (N21) on an input side. Further, a drain of the FET (N23) is connected to a drain of the FET (P11).

A predetermined voltage V23 is extracted from the D/A converter circuit 23 described in [3-2], the voltage V23 is supplied to a variable constant-current source QCP as a control voltage, and a constant current (charge pump current) ICP is supplied from the variable constant-current source QCP to the FET (N21).

A point of connection between the switch circuit SW1 and the switch circuit SW2 is connected to an output terminal T3, and is connected to a point DN of connection between the switch circuit SW3 and the switch circuit SW4 via an amplifier G1 for a voltage follower.

An output pulse PUP is supplied from the phase comparator circuit 13 to gates of FETs (N1 and P3) of the switch circuits SW1 and SW3. An output pulse PUPB is supplied from the phase comparator circuit 13 to gates of FETs (P1 and N3) of the switch circuits SW1 and SW3. An output pulse PDN is supplied from the phase comparator circuit 13 to gates of FETs (N2 and P4) of the switch circuits SW2 and SW4. An output pulse PDNB is supplied from the phase comparator circuit 13 to gates of FETs (P2 and N4) of the switch circuits SW2 and SW4.

Thus, because the current ICP is supplied from the variable constant-current source QCP to the FET (N21), the charge pump current ICP flows out from the drain of the FET (P12), and the charge pump current ICP flows into the drain of the FET (N22). Because the switch circuits SW1 to SW4 are subjected to on-off control so as to correspond to the pulses PUP to PDNB, this circuit operates as the charge pump circuit 14 described with reference to FIG. 4.

At this time, as in the charge pump circuit 14 in FIG. 4, a PLL characteristic can be held constant, and a configuration therefor is simple. In addition, when the magnitude of the output constant current ICP of the variable constant-current source QCP is changed, the magnitude of the charge pump current ICP flowing through the FETs (P12 and N22) can be changed simultaneously.

Further, according to the charge pump circuit 14, the switch circuits SW1 to SW4 are formed by pairs of the N-channel FETs (N1 to N4) and the P-channel FETs (P1 to P4), respectively. It is therefore possible to suppress the peak value of a current flowing through a gate-to-drain parasitic capacitance (overlap capacitance) occurring at a time of switching the switch circuits SW1 to SW4.

The present application contains subject matter related to that disclosed in Japanese Priority Patent Application JP 2008-089373 filed in the Japan Patent Office on Mar. 31, 2008, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A phase-locked loop circuit comprising:
a voltage controlled oscillator;
a variable frequency divider circuit for frequency-dividing an oscillating signal of the voltage controlled oscillator into a 1/N (N is an integer) frequency;
a phase comparator circuit for comparing phases of a frequency-divided signal output from the variable frequency divider circuit and a reference signal of a reference frequency with each other;
a charge pump circuit for outputting a charge pump current changed in pulse width so as to correspond to a phase difference between said frequency-divided signal and said reference signal from a comparison output of the phase comparator circuit;
a loop filter for being supplied with said charge pump current and outputting a direct-current voltage changed in level so as to correspond to the phase difference between said frequency-divided signal and said reference signal, and supplying the direct-current voltage to said voltage controlled oscillator as control voltage for controlling oscillating frequency of said voltage controlled oscillator; and
a control circuit for calculating a value of said charge pump current as a function of the oscillating frequency of said voltage controlled oscillator and a coefficient for setting a phase-locked loop band, and setting the value of said charge pump current in said charge pump circuit,
wherein said charge pump circuit includes
a first switch circuit, a second switch circuit, a third switch circuit, and a fourth switch circuit subjected to on-off control by the comparison output of said phase comparator circuit and connected to each other by bridge connection,
a first constant-current source for outputting a discharge type charge pump current, said first constant-current source being connected to a point of connection between said first switch circuit and said third switch circuit,
a second constant-current source for outputting a suction type charge pump current, said second constant-current source being connected to a point of connection between said second switch circuit and said fourth switch circuit, and
a voltage follower connected between a point of connection between said first switch circuit and said second switch circuit and a point of connection between said third switch circuit and said fourth switch circuit, and
the point of connection between said first switch circuit and said second switch circuit is connected to said loop filter.

2. The phase-locked loop circuit according to claim 1,
wherein each of said circuits is integrated into one integrated circuit on a chip, and
a memory for retaining data necessary for calculation of said control circuit is also an integrated circuit integrated on the chip.

3. The phase-locked loop circuit according to claim 1,
wherein said function is expressed as a linear equation with the oscillating frequency of said voltage controlled oscillator as a variable.

4. The phase-locked loop circuit according to claim 1,
wherein said function is calculated on an on-chip basis.

5. A phase-locked loop circuit, comprising:
a voltage controlled oscillator;
a variable frequency divider circuit for frequency-dividing an oscillating signal of the voltage controlled oscillator into a 1/N (N is an integer) frequency;
a phase comparator circuit for comparing phases of a frequency-divided signal output from the variable frequency divider circuit and a reference signal of a reference frequency with each other;
a charge pump circuit for outputting a charge pump current changed in pulse width so as to correspond to a phase difference between said frequency-divided signal and said reference signal from a comparison output of the phase comparator circuit;
a loop filter for being supplied with said charge pump current and outputting a direct-current voltage changed in level so as to correspond to the phase difference between said frequency-divided signal and said reference signal, and supplying the direct-current voltage to said voltage controlled oscillator as control voltage for controlling oscillating frequency of said voltage controlled oscillator; and
a control circuit for calculating a value of said charge pump current as a function of the oscillating frequency of said voltage controlled oscillator and a coefficient for setting a phase-locked loop band, and setting the value of said charge pump current in said charge pump circuit,
wherein said function is a linear equation (1) that is expressed as $$ICP = KBW(A \cdot fVCO + B) \qquad (1)$$

where ICP is said charge pump current,
fVCO is said oscillating frequency,
KBW is a constant,
A and B are a constant, and
values of said constants KBW, A, and B are supplied from the memory,
wherein KBW is defined according to the following equations (2) and (3):

$$KBW = 2 \cdot pi / ZP \cdot fREF \cdot G0 \qquad (2)$$

$$G0 = ICP/2 \cdot pi \cdot ZP \cdot KVCO/N \qquad (3)$$

where
ZP is an impedance of said loop filter,
fREF is said reference frequency, and
KVCO is a control sensitivity of said voltage controlled oscillator.

* * * * *